(12) United States Patent
Enright et al.

(10) Patent No.: US 11,477,912 B2
(45) Date of Patent: *Oct. 18, 2022

(54) EXTERNAL ROBOTIC SYSTEM FOR LIQUID IMMERSION COOLING PLATFORM

(71) Applicant: TMGCore, Inc., Plano, TX (US)

(72) Inventors: John David Enright, Plano, TX (US); Jacob Mertel, Plano, TX (US); Taylor Monnig, Plano, TX (US); William Hadala, Plano, TX (US)

(73) Assignee: TMGCore, INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/392,640

(22) Filed: Aug. 3, 2021

(65) Prior Publication Data

US 2021/0378140 A1  Dec. 2, 2021

Related U.S. Application Data

(63) Continuation of application No. 17/094,939, filed on Nov. 11, 2020, now Pat. No. 11,134,586.

(60) Provisional application No. 62/933,803, filed on Nov. 11, 2019.

(51) Int. Cl.
  *H05K 7/20* (2006.01)
  *G06F 1/18* (2006.01)
  *G05D 1/02* (2020.01)

(52) U.S. Cl.
  CPC ....... *H05K 7/20236* (2013.01); *G05D 1/0212* (2013.01); *G06F 1/181* (2013.01); *H05K 7/20281* (2013.01)

(58) Field of Classification Search
  CPC ............... H05K 7/203; H05K 7/20818; H05K 7/20809; H05K 7/20318; H05K 7/20827; H05K 7/20836; H05K 7/20327; H05K 7/20236; H05K 7/20281; H04L 67/12; H04L 67/10; H04L 2012/40273; G06F 1/20; G06F 1/206; G06F 2200/201; G06F 9/542; G05D 1/0011; G05D 1/10; G05D 1/0022; G05D 2201/0207
  USPC .......... 165/104.19; 361/679.46, 679.53, 699, 361/700

See application file for complete search history.

(56) References Cited

U.S. PATENT DOCUMENTS

| | | | |
|---|---|---|---|
| 9,827,683 B1* | 11/2017 | Hance | B65G 1/065 |
| 10,398,055 B1* | 8/2019 | Tandon | G06Q 30/016 |
| 10,750,637 B1* | 8/2020 | Alissa | H05K 7/20781 |
| 2007/0094535 A1* | 4/2007 | Prasee | G06Q 50/30 |
| | | | 714/5.11 |
| 2015/0070846 A1* | 3/2015 | Shelnutt | H05K 7/20809 |
| | | | 361/699 |
| 2020/0081439 A1* | 3/2020 | Mukherjee | B25J 15/0047 |
| 2022/0032446 A1* | 2/2022 | Jiang | B08B 13/00 |

* cited by examiner

*Primary Examiner* — Mandeep S Buttar

(74) *Attorney, Agent, or Firm* — Hunton Andrews Kurth LLP

(57) ABSTRACT

An autonomous vehicle is disclosed which can map a facility and navigate its way to a particular liquid cooling system. The vehicle can be in communication with a central server, which can control the vehicle. The vehicle can align itself against the liquid cooling system and receive a computing device on a platform of the vehicle. The platform can be lowered and secured in an enclosure of the vehicle. Then, the vehicle can transport the computing device to a storage facility.

20 Claims, 6 Drawing Sheets

EXTERNAL ROBOTIC SYSTEM FOR LIQUID IMMERSION COOLING PLATFORM

CROSS-REFERENCE TO RELATED APPLICATIONS

The present application is a continuation of U.S. Ser. No. 17/094,939 filed Nov. 11, 2020 which application claims priority to U.S. provisional application filed Nov. 11, 2019 as U.S. Ser. No. 62/933,803 both of which applications are incorporated herein by reference.

FIELD OF THE INVENTION

The present inventions are directed to robotic systems for liquid immersion cooled computing systems, namely liquid immersion cooled computing systems utilizing pressure and/or vapor management.

SUMMARY

Two-phase liquid immersion cooling systems and processes are described in, for example, WO2020/102090 filed Nov. 11, 2019 which is incorporated herein by reference. In such systems and processes heat generating computer components cause a dielectric fluid in its liquid phase to vaporize. The dielectric vapor is then condensed back into a liquid phase and used to cool the computer components. Such systems are complex and must be designed to be both efficient and effective to adequately protect the expensive computing components from damage due to transportation to or from the cooling system. Accordingly, what is needed is a robotic system which can automatically receive a computing device from the liquid cooling system and securely transport the computing device to a storage facility. Additionally, what is needed is a robotic system can automatically retrieve a computing device from a storage location and securely transport the computing device to the liquid cooling system.

Advantageously, the present inventions meet the aforementioned needs and more. In particular, an autonomous vehicle is disclosed which can map a facility and navigate its way to a particular liquid cooling system. The vehicle can be in communication with a central server, which can control the vehicle. The vehicle can align itself against the liquid cooling system and receive a computing device on a platform of the vehicle. The platform can be lowered and secured in an enclosure of the vehicle. Then, the vehicle can transport the computing device to a storage facility.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
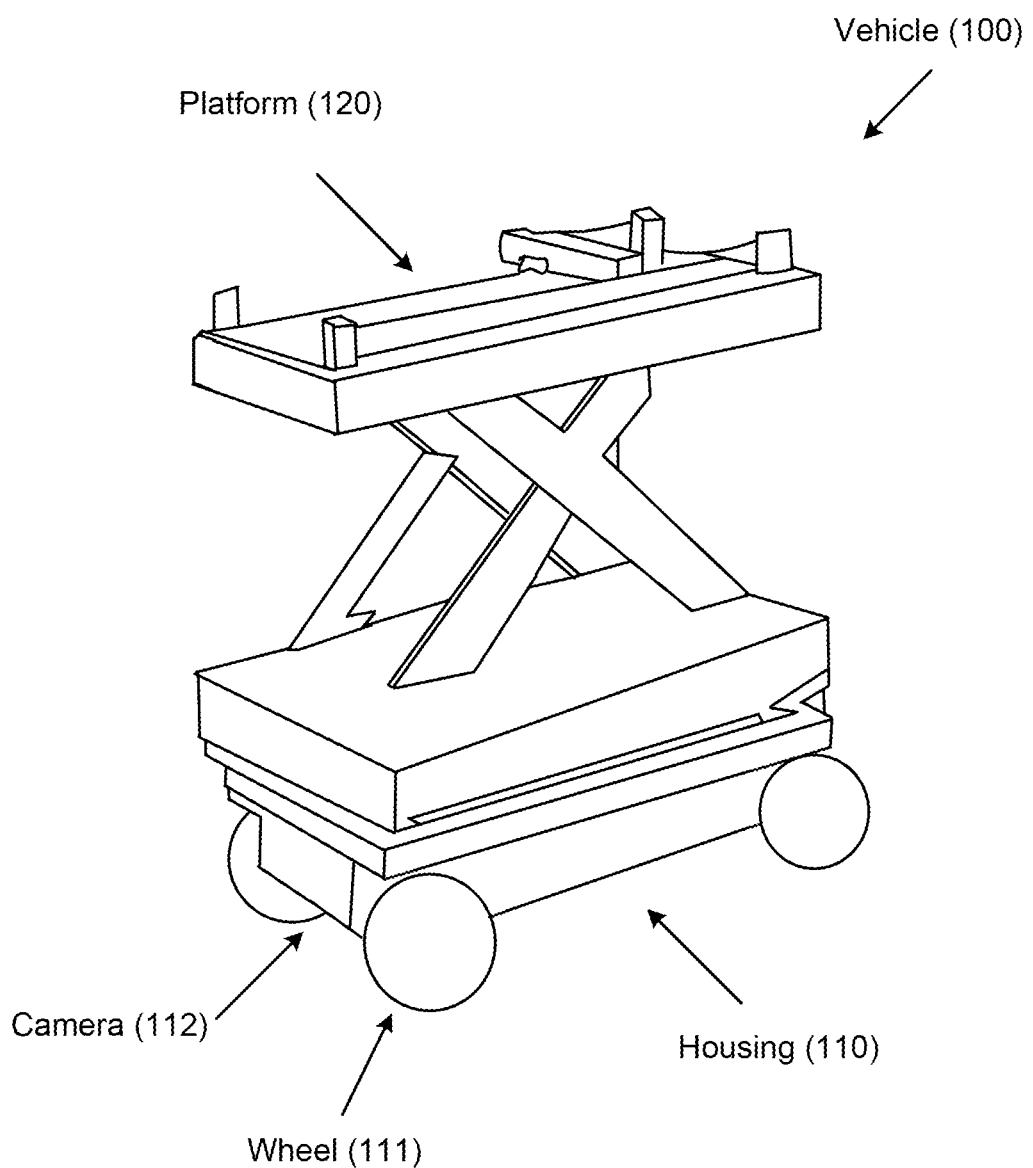
FIG. 1 shows a vehicle according to an example embodiment.

Exemplary embodiments of the invention will now be described in order to illustrate various features of the invention. The embodiments described herein are not intended to be limiting as to the scope of the invention, but rather are intended to provide examples of the components, use, and operation of the invention.

An Exemplary Embodiment of an External Robotic System

In one example embodiment, an immersion cooling system or a vessel can include a tank, a computing device, an internal robot, an absorption unit, and a management system. The tank can be a pressure controlled tank maintained at the atmospheric pressure (or within a range thereof). The tank can include a bath area and a sump area, and the computing device can be immersed in a dielectric fluid in the bath area of the tank. The computing device can be connected to a network and perform various processing tasks while immersed in the dielectric fluid. The tank can include a lid for accessing the bath area, the computing device and the sump area. The tank can be fluidly coupled to the absorption unit, and a plurality of valves can selectively connect or disconnect the tank to and from the absorption unit so that dielectric vapor can transfer to the absorption unit, or vice versa. The internal robot can be a gantry robot, which can lift the computing device from the tank of the vessel when the lid of the tank is open. The gantry robot can include a series of linear actuators. For example, the robot can include an actuator for movement in each of a plurality of directions, e.g., horizontal and vertical.

In one example embodiment, the immersion cooling system can interact with an external robot. The external robot can be an autonomous vehicle (or vehicle) which can be in communication with the management system (or another system in communication with one or more vehicles). The immersion cooling system can communicate with the vehicle directly (e.g., the management system can communicate with a control system of the vehicle) or through a central server. In one example, the immersion cooling system can interact with the vehicle by removing a computing device from the tank and placing the computing device on the vehicle. The immersion cooling system can also interact with the vehicle by removing a computing device from the vehicle and placing the computing device in the tank or a storage place such as a magazine. For example, the gantry robot can move in between a home position, a magazine position, a rack position and a vehicle position. Upon receiving a communication that the vehicle is at the vehicle position, the management system can instruct the robot to lift a computing device from, e.g., the rack or the magazine, and move the computing device to the vehicle position to place the computing device on the vehicle.

In one example embodiment, the gantry robot can receive instructions from the management system to remove or replace various components of the vessel, e.g., computing device, filter, etc. For example, the gantry robot can receive an instruction to remove a computing device and place it on the vehicle, so that the computing device can be transported to a storage location or a repair area. As another example, the gantry robot can receive an instruction to remove a computing device from the vehicle and place the computing device in a rack. In one example, the instruction is initiated by the management system. For example, the management system makes a determination that a computing device needs to be replaced. The management system can call a vehicle to approach the vessel. Upon arrival of the vehicle, the management system can instruct the gantry robot to remove a computing device and place it on the vehicle. In one example, a central server can direct a communication between the management system and the vehicle.

In one example embodiment, the vehicle can be a robotic platform capable of autonomous, condition-based or user-directed actions. In one example, the vehicle can be designed to facilitate and support the operation of autonomous datacenters and distributed computing environments. In one example, the vehicle can include a housing for a motor, a control system, a safety device, a battery, a data and/or power interface, a transceiver and other components. The housing can be mechanically coupled to one or more wheels, which can be driven by the motor. In one example, the control system can instruct the motor to drive the vehicle in a predetermined direction or path. In one example, the control system can determine the direction of the movement of the vehicle. In one example, the control system can be in communication with a central server, the management system and/or another system which can direct the vehicle to perform a specific task, e.g., drop a computing device at a designated vessel or pick up a computing device at the designated vessel. The communication can take place through the transceiver.

In one example, the safety device can be a sensor or a camera. The safety device can determine if there is any obstacle in the path of the vehicle or gather other types of data, e.g., temperature, humidity, etc. If an obstacle is detected, the control system can stop the vehicle or change its path, e.g., to avoid the obstacle. In one example, the control system can include an object recognition module. The object recognition module can determine various objects around the vehicle and change the path of the vehicle based on the detected objects. In one example embodiment, the object recognition module can detect an object that a vehicle needs to approach, and based on the detection, the control system can direct the vehicle toward the object, e.g., vessel No. 5. In one example embodiment, based on the data received from the safety device, e.g., image data, the control system can generate a map of the location and assign various devices, e.g., vessels, to the locations on the map. The assignment can be done based on the vehicle's prior tasks and visits to different locations in the facility. The control system can use the map to direct the vehicle to a desired location using the map. In one example embodiment, the control system can share data with a management system or a central server. The shared data can be used by the vessel to optimize its operations, e.g., the temperature and humidity data can be used by the absorption unit of the vessel, or the data can optimize the startup and/or shutdown operations of the vessel.

In one example, the vehicle can include various sensors, such as cameras, temperature sensors, humidity sensors, smoke detectors, oxygen sensors, and refrigerant leak detectors (e.g., detects leakage of the dielectric fluid or vapor). In this example, the vehicle may include one or more modes of operation. For example, the vehicle can include a patrol tour mode of operation. In this mode of operation, the vehicle can navigate to various locations within a facility to collect and monitor data received from these sensors. In another example, the vehicle can constantly collect and monitor data received from these sensors. The vehicle can relay the data to the management system or a central server for further analysis. This data can provide the facility operators with real time location specific data which is constantly updated as the vehicle performs its functions and conducts patrol tours.

In one example embodiment, the vehicle can receive power and data through the interface. For example, the vehicle can be assigned a dedicated location for receiving electric power for charging its battery. Once the control system determines that the battery charge has fallen below a threshold amount, the control system can direct the vehicle to the dedicated location for charging the battery. In one example, the control system can include a predictive model for determining the optimal time for charging the battery. For example, based on the vehicle's past state of charge as well as the tasks assigned to the vehicle and the distance that the vehicle traveled, the predictive model can determine how quickly the vehicle will run out of battery and determine an optimal time for charging the battery.

In one example embodiment, the vehicle can include a position detection system. The position detection system can assist the vehicle to navigate its way to desired locations. For example, the control system can determine the vehicle's position based on GPS signals. As another example, the control system can determine the vehicle's position based on the vehicle's relative location compared to the location of one or more wireless access points (i.e., localization of the vehicle relative to the access points). Using the position (and possibly a map), the control system can direct the vehicle to a desired location. RSSI, Fingerprinting, Angle of Arrival ("AoA") and Time of Flight ("ToF") are four exemplary techniques which can facilitate this determination. In these embodiments, the vehicle can be connected to one or more wireless access points at the location and perform any of the named localization techniques to determine the relative location of the vehicle.

In the RSSI technique, the intensity of the received signal is measured from several different access points. Subsequently, a propagation model is used to determine the distance between the vehicle and each access point. Then, trilateration techniques can be used to calculate the estimated vehicle position relative to a known position of the access points. The Fingerprinting technique includes two steps. In the first step, at various locations in the building, a collection of Wi-Fi signals from the access points is sampled to create a position fingerprint. In the second step, which is the online positioning step, fingerprint information is collected around the position to be localized and compared with the sampled position fingerprint. In the AoA technique, multiple antennas are used to estimate an angle of arrival of the multipath signals received at the antenna arrays in the access points. Subsequently, the triangulation technique is used to calculate the location of the vehicle. In the ToF technique, a travel time for a signal to the vehicle and a return time from the vehicle is measured. Using these measurements, the distance between the vehicle and the access point is determined, and hence, a trilateration technique can be used to calculate the estimated position of the vehicle relative to the access points.

In one example, the vehicle can use laser based mapping technologies to create a map and navigate to the location via the map. The map can identify the locations of certain objects and/or facilities, e.g., the location of charging centers, computing device storage magazines, and each of the vessels with which the vehicle will interact. Once mapped, the vehicle can be directed to automatically move to each of these locations, charge its batteries, retrieve and store computing devices, and perform other functions. In one example, one or more facility maps can be stored within the vehicle. This can allow the vehicle to be used at multiple locations without the need to learn and/or re-learn the layouts of each location.

In one example embodiment, the vehicle can include a platform. The platform can be movable, e.g., the platform can move vertically and/or horizontally relative to the housing. The vertical and/or horizontal movement of the platform can facilitate placement of computing devices on the platform. These computing devices can be received from a storage unit or a gantry robot. For example, by moving up or down the platform, the vehicle can adjust its height such that a computing device can be placed on the platform from a storage magazine or a gantry robot. In one example embodiment, the platform can rotate horizontally or even tilt, to facilitate placement of a computing device on the platform or facilitate placement of a computing device on a wagon attached to the computing device.

In one example, the vehicle can include a robotic arm (e.g., a gripper arm) which can receive a computing device and/or place the computing device on the platform. The robotic arm can have various degrees of freedom. The robotic arm can also interface with the gantry robot and/or a storage unit. In one example, the robotic arm can protrude beyond the end of the platform to allow for the retrieval and placement of the computing devices in a storage unit. In one example, the control system can command the robotic arm to move and/or receive the computing device. In one example, the control system and the management system can align the vehicle and vessel such that the gantry robot at the vehicle position and the robotic arm are aligned. In this example, both the vessel and vehicle can communicate and use various sensors to minimize any misalignment. For example, the vehicle and the vessel can be aligned if the distance between a predefined point on the vehicle and a predefined point on the vessel is within a predefined threshold.

In one example, the control system and the management system can communicate information such that the vehicle can position itself within a vicinity of a storage magazine of the vessel. The vehicle can also align the height and location of the platform such that the platform can receive a computing device from the storage magazine. In one example, the vessel can change the position of the storage magazine and open a door of the magazine such that the magazine can place a computing device on a platform of the vehicle. For example, the management system can direct the storage magazine to move (e.g., lower or higher) and/or rotate such that it is close to the vehicle (and/or the robotic arm), and thus, ensure a smooth placement of a computing device from the storage magazine over the platform of the vehicle.

In one example, the vehicle can include an enclosure with a door. In this example, the door can open and/or close, e.g., using an actuator. The platform can move out of the enclosure once the door is open. The door can also close once the platform moves into the enclosure. In one example, the door can open and the platform can elevate out of the enclosure. The vehicle can receive a computing device (either directly or via a robotic arm). The computing device can be placed on the platform. Once the computing device is placed on the platform, the platform can be lowered and the door can close. Once the door closes, the computing device can be secured within the enclosure against unauthorized access and the environmental elements. In one example, the vehicle can include one or more sensors which can detect when a computing device is placed on the platform. Once the vehicle detects placement of a computing device on the platform, the vehicle can lower the platform and close the door (e.g., if the vehicle does not expect to receive any other computing devices). Similarly, once the sensor detects that a computing device is lifted from the platform, the vehicle can lower the platform and close the door (e.g., if no other computing devices are expected to be lifted).

In one example embodiment, a facility can include a plurality of vehicles and one or more vessels. Each vehicle can include a control system and each vessel can include a management system. The vehicles and vessels can be in communication with a central server (and/or one or more management systems) for managing the vehicles and tasks. The central server can monitor each vehicle and manage its operation. For example, the central server can assign tasks to each vehicle based on a determination that the assigned vehicle is the most suitable vehicle for performing the task. In one example, the task can be, e.g., picking up a computing device from a storage location and delivering the computing device to a vessel; picking up a computing device from a vessel and delivering the computing device to a storage location; conducting a patrol tour; providing data from a designated location of the facility, etc. In one example, the central server can assign tasks to the vehicles based on each vehicle's proximity to a vessel, a number of tasks performed by the vehicle, a number of tasks pending for the vehicle, a state of charge of the battery of the vehicle, a number of other vehicles without any pending tasks, an average number of tasks assigned to other vehicles, etc.

The central server can optimize one or more objectives. For example, the central server can minimize the time that it takes for a task or an average task to be performed by the vehicles. As another example, the central server can minimize a number of vehicles in service for a given average time for a task to be performed. As another example, the central server can maximize the presence of vehicles in different locations in the facility, e.g., to collect data or record video using a camera. As another example, the central server can maximize operational time (without the need for charging the battery) for all the vehicles by minimizing battery usage. As another example, the central server can minimize the wait time for a vehicle to obtain a spot at a charging facility.

In one example embodiment, the central server can receive data from one or more vessels and based on the data, can assign tasks to one or more vehicles. In one example, a management system of a vessel can provide the central server with data such as voltage or current reading in a computing device, the temperature of the tank, the pressure of the tank, a malfunction in a device, etc. Using this data the central server can determine a task, e.g., replace or remove a computing device. Subsequently, the central server can delegate the task to a vehicle and the vehicle can approach the vessel to remove or replace the computing device. In one example, the management system can communicate a task to the central server and the central server can delegate the task to a vehicle. In one example, the system of the present disclosure may not utilize a central server. In this example, a management system of a vessel (or a plurality of management systems of a plurality of vessels) and/or a control system of a vehicle (and/or a plurality of control systems of a plurality of vehicles) can execute the tasks described herein.

In one example, the central server may integrate each vehicle into a vehicle-fleet-based solution. This can allow the vehicle to move computing devices or other equipment between various vessel locations, service centers, storage locations, and other locations. In one example, each vehicle can transport a computing device, enter a facility and exit the facility. These functions can be coordinated through the central server. In one example, a facility at which a vehicle is employed can include specialized doors and/or passage ways designed to allow for ingress and egress of the vehicle. Such doors may include roll up mechanisms to allow for the passage of the vehicle or specialized sally ports designed to allow for both the movement of the vehicle or, under other circumstances, the passage of personnel. In one example, a verification mechanism can be implemented at the entrance to a facility. For example, there can be an unsecured door and a secured door. The unsecured door can open and allow the vehicle to pass into a sally port. Upon confirmation that only the vehicle has entered, and not an unauthorized intruder, the secure door can open. The verification mechanism can use RFID scans to detect the identity of the vehicle. The verification mechanism can also use a heat detection system, imaging system or another system to detect whether there is an intruder in the sally port.

In one example embodiment, the vehicle can include monitors, cameras, microphones and speakers. These devices can enable a remote operator to interact with, escort, monitor and provide assistance to a local operator, e.g., at the direction of a centralized operations center or other location. These devices will allow for work at remote sites and edge locations to be performed by "less skilled" employees at the supervision of "more skilled" employees, thereby allowing for a reduction in the need of "more skilled" employees.

In one example embodiment, a wagon can be coupled to a vehicle. Similar to the platform for the vehicle, the wagon can also include a platform for holding computing devices. In one example, the platform can be elevated and lowered similar to the vehicle. In one example, the wagon can include a door and an enclosure. In one example, the wagon can include a handle on one side to support movement by human operators and a mechanical interface on the other which can be used for automatic attachment to a vehicle. The wagon can be placed, released and retrieved later by either vehicles or human operators. In one example, it can be advantageous to use a wagon as one of the means of moving computing devices to and from different facilities by humans. The computing devices can be large and heavy, and thus, a wagon can be ideal for transporting the computing devices between facilities by humans and/or vehicles.

In one example, the wagon can include an RFID chip which can inform the vehicle about the identity of the wagon. The vehicle can track the load that is placed in the wagon and report this information to the central server.

Figure 2:
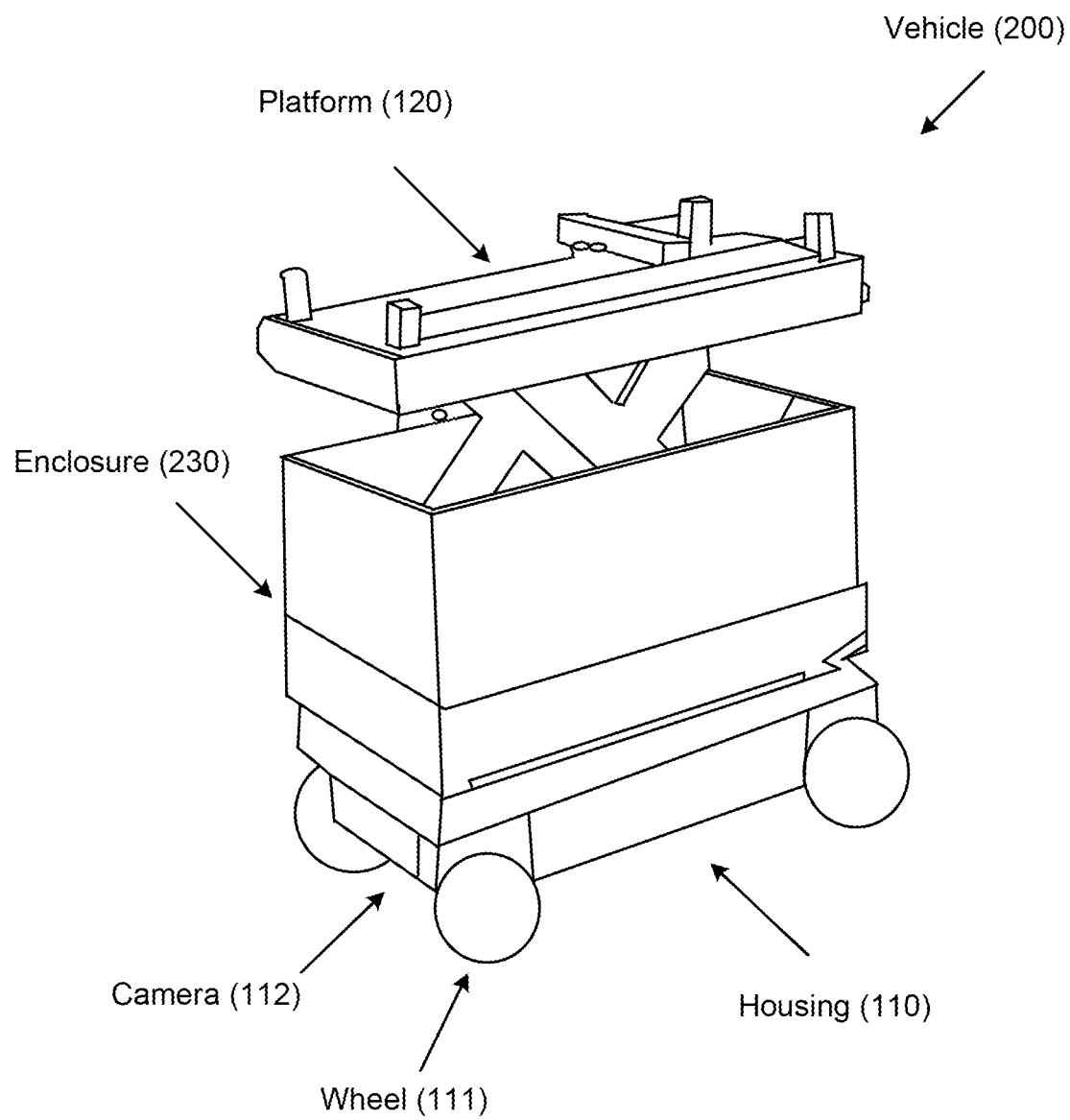
FIG. 2 shows a vehicle with an enclosure according to an example embodiment.
Figure 3:
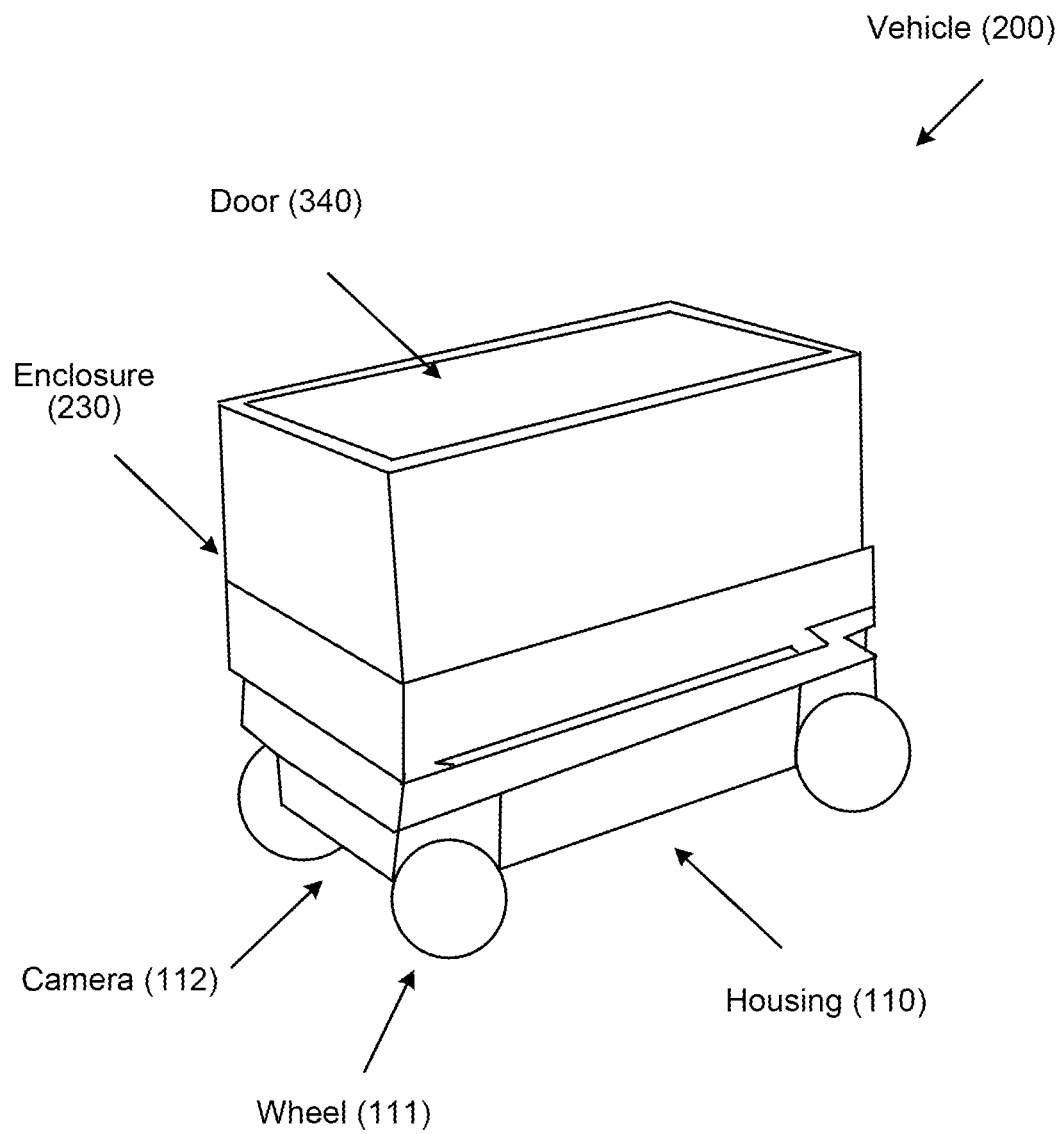
FIG. 3 shows a vehicle with a closed door according to an example embodiment.

FIGS. 1-3 show exemplary embodiments of a vehicle. In FIG. 1, a vehicle 100 is displayed. The vehicle 100 can include a housing 110 which includes a camera 112. The housing 110 is coupled to the wheel 111. The vehicle 100 can further include a platform 120. In this example, the platform 120 is elevated relative to the housing 110.

FIG. 2 shows a vehicle with an enclosure 230 according to an example embodiment. The enclosure 230 can house the platform 120 when the platform 120 is lowered. The enclosure 230 can also house a number of computing devices. FIG. 3 shows a vehicle with a closed door 340 according to an example embodiment. In this example, the platform 120 is lowered and housed in the enclosure 230. The door 340 secures the computing device against unauthorized access or environmental elements.

Figure 4:
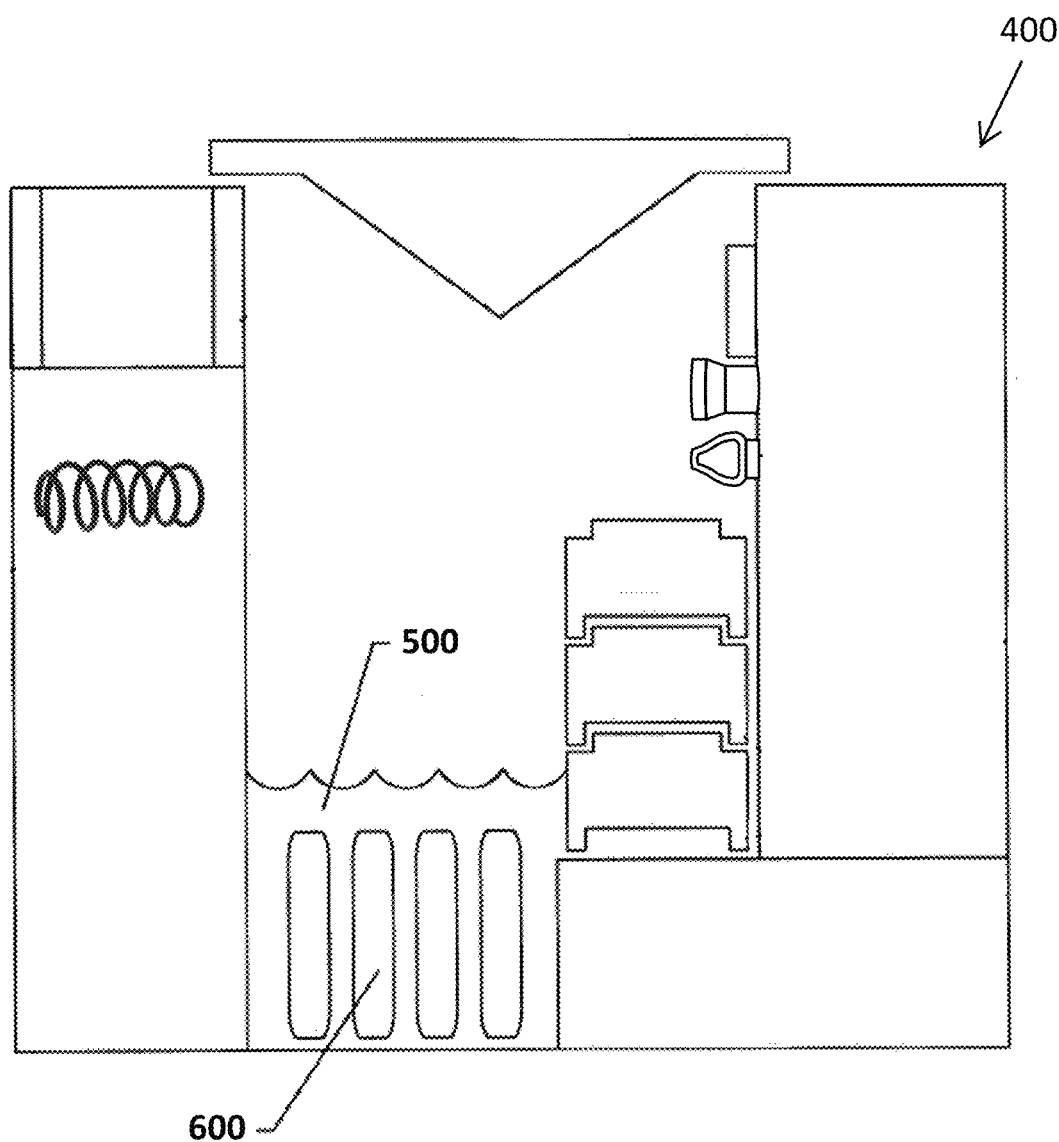
FIG. 4 shows a vessel comprising a tank.

FIG. 4 shows a vessel 400 comprising a tank configured to hold a liquid phase 500 and a gas phase of a fluid; a structure within the tank configured to hold computer components 600 to be at least partially submerged within the liquid phase 500 of the fluid during an operation of the system.

Figure 5:
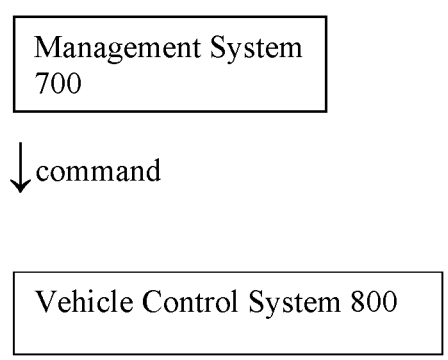
FIG. 5 shows a management system providing a command to a vehicle control system.

As shown in FIG. 5 a management system 700 transmits a command to a vehicle control system 800. In response to receiving the command, the control system 800 of the vehicle 200 is configured to approach a vehicle location of the vessel 400. In response to arriving at the vehicle location of the vessel 400, the management system 700 is configured to instruct the robot to pick up the computer component 600 and deliver the computer component 600 to the vehicle location of the vessel 400. The management system 700 is configured to transmit a command to the control system 800 in response to detection of an operating condition. The operating condition is a voltage, a current, a temperature or a pressure that exceeds a threshold. A sensor is configured to detect a placement of the computer component over the platform 120. In response to arriving at a vehicle location of the vessel 400, the control system 800 is configured to open the door 340. The vehicle may further comprises a robotic arm configured to receive the computer component 600 from the robot and/or place the computer component over the platform 120. The management system 700 is configured to determine a relative position of the vehicle and/or configured to construct a map for a location and/or configured to navigate the vehicle to a desired location using the relative position of the vehicle and the map.

Figure 6:
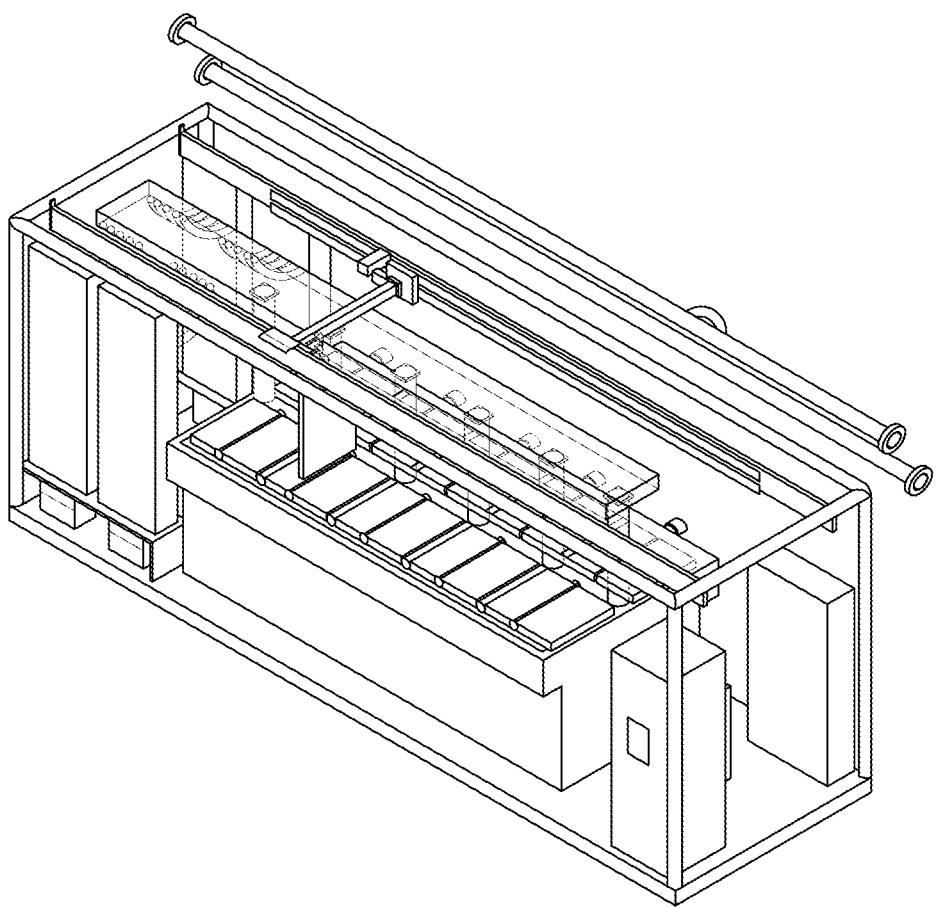
FIG. 6 shows a vessel in which the gantry robot is exterior of a tank.

FIG. 6 depicts an embodiment of the vessel in which the gantry robot is exterior of a tank which houses the chassis and/or computing components. In this embodiment, the tank may be smaller but will need to be opened more often for the external gantry robot to access the chassis and/or power supplies inside the tank.

What is claimed is:

1. A system comprising:
    a vessel comprising:
        a tank, wherein the tank is configured to hold a liquid phase and a gas phase of a fluid;
        a structure within the tank configured to hold a computer component to be at least partially submerged within the liquid phase of the fluid during an operation of the system; and
        a management system;
    a vehicle, comprising:
        a platform;
        a sensor;
        a transceiver; and
        a control system configured to receive a signal from the management system; and a robot configured to remove the computer component from the tank and place the computer component over the vehicle.

2. The system of claim 1, wherein the vehicle is configured to receive a command from the management system.

3. The system of claim 2, wherein, in response to receiving the command, the control system of the vehicle is configured to approach a vehicle location of the vessel.

4. The system of claim 3, wherein, in response to arriving at the vehicle location of the vessel, the management system is configured to instruct the robot to pick up the computer component and deliver the computer component to the vehicle location of the vessel.

5. The system of claim 1, wherein the management system is configured to transmit a command to the control system in response to detection of an operating condition.

6. The system of claim 5, wherein the operating condition is a voltage, a current, a temperature or a pressure that exceeds a threshold.

7. The system of claim 1, wherein the vehicle is configured to adjust a height of the platform to receive the computer component from the robot.

8. The system of claim 5, wherein the sensor is configured to detect a placement of the computer component over the platform.

9. The system of claim 1, wherein the vehicle further comprises an enclosure.

10. The system of claim 7, wherein, in response to detection of a placement of the computer component over the platform, the control system is configured to lower the platform.

11. The system of claim 1, wherein the vehicle further comprises a door.

12. The system of claim 11, wherein, in response to lowering the platform, the control system is configured to close the door.

13. The system of claim 11, wherein, in response to arriving at a vehicle location of the vessel, the control system is configured to open the door.

14. The system of claim 1, wherein the vehicle further comprises a robotic arm.

15. The system of claim 14, wherein the robotic arm is configured to receive the computer component from the robot.

16. The system of claim 15, wherein the robotic arm is configured to place the computer component over the platform.

17. The system of claim 1, wherein the management system is configured to determine a relative position of the vehicle.

18. The system of claim 17, wherein the management system is configured to construct a map for a location.

19. The system of claim 18, wherein the management system is configured to navigate the vehicle to a desired location using the relative position of the vehicle and the map.

20. The system of claim 1, wherein the vehicle further comprises a monitor, a speaker, a microphone and a camera.

* * * * *